United States Patent
Chun et al.

(10) Patent No.: US 7,847,478 B2
(45) Date of Patent: Dec. 7, 2010

(54) ORGANIC LIGHT EMITTING DISPLAY PANEL WITH ABSORBING MEMBERS AND METHOD OF FABRICATING THE SAME

(75) Inventors: Pil Geun Chun, Yongin (KR); Tae Wook Kang, Seungnam (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 590 days.

(21) Appl. No.: 11/413,926

(22) Filed: Apr. 28, 2006

(65) Prior Publication Data

US 2006/0244376 A1    Nov. 2, 2006

(30) Foreign Application Priority Data

May 2, 2005    (KR) ............. 10-2005-0036874

(51) Int. Cl.
  *H01J 1/62* (2006.01)
  *H01J 63/04* (2006.01)
  *H01J 9/26* (2006.01)
(52) U.S. Cl. ............... 313/506; 428/68; 313/495; 313/496; 313/512
(58) Field of Classification Search ........... 313/495, 313/498, 501, 512
  See application file for complete search history.

(56) References Cited

U.S. PATENT DOCUMENTS

| | | | |
|---|---|---|---|
| 6,653,777 B1 * | 11/2003 | Onishi | 313/495 |
| 2001/0046579 A1 * | 11/2001 | Ishii et al. | 428/68 |
| 2002/0033664 A1 * | 3/2002 | Kobayashi | 313/504 |
| 2002/0125817 A1 * | 9/2002 | Yamazaki et al. | 313/498 |
| 2003/0205699 A1 | 11/2003 | Morii et al. | |
| 2004/0075380 A1 * | 4/2004 | Takemoto et al. | 313/500 |
| 2004/0075801 A1 | 4/2004 | Choi et al. | |
| 2004/0195958 A1 * | 10/2004 | Ito et al. | 313/496 |

(Continued)

FOREIGN PATENT DOCUMENTS

CN    1575048 A    2/2005

(Continued)

OTHER PUBLICATIONS

Korean Patent Abstracts, Publication Number: 100440543 B1; Publication Date: Jul. 6, 2004; in the name of Lee.

(Continued)

*Primary Examiner*—Sikha Roy
*Assistant Examiner*—Tracie Green
(74) *Attorney, Agent, or Firm*—Christie, Parker & Hale, LLP

(57) ABSTRACT

An organic light emitting display capable of preventing the generation of screen distortion caused by a thick film phenomenon that occurs when the internal surface of a panel is coated with an absorbing member and a method of fabricating the same. The organic light emitting display includes a substrate on which an image display unit including at least one organic light emitting diode is formed. A panel is formed on the substrate to seal the image display unit. A first absorbing member is formed on the internal surface of the panel on the image display unit that faces the organic light emitting diode. A second absorbing member is formed on the circumference of the image display unit between the first absorbing member and the internal surface of the panel to overlap the circumference of the first absorbing member.

15 Claims, 5 Drawing Sheets

U.S. PATENT DOCUMENTS

| | | | |
|---|---|---|---|
| 2004/0232833 A1* | 11/2004 | Menda et al. | 313/512 |
| 2005/0046338 A1* | 3/2005 | Park | 313/504 |
| 2005/0073243 A1* | 4/2005 | Yamazaki et al. | 313/498 |
| 2005/0174039 A1* | 8/2005 | Nishikawa et al. | 313/495 |

FOREIGN PATENT DOCUMENTS

| | | |
|---|---|---|
| JP | 2003-234438 | 8/2003 |
| KR | 10-0440543 | 7/2004 |
| KR | 10-2004-0110753 | 12/2004 |

OTHER PUBLICATIONS

Korean Patent Abstracts, Publication Number: 1020040110753 A; Publication Date: Dec. 31, 2004; in the name of Kim, et al.

Office Action with English translation dated Dec. 19, 2008, for corresponding Chinese Patent Application No. 200610072114.2 indicating relevance of cited reference.

* cited by examiner

ORGANIC LIGHT EMITTING DISPLAY PANEL WITH ABSORBING MEMBERS AND METHOD OF FABRICATING THE SAME

CROSS-REFERENCE TO RELATED APPLICATIONS

This application claims the priority to and the benefit of Korean Patent Application No. 2005-0036874, filed on May 2, 2005, in the Korean Intellectual Property Office, the entire content of which is incorporated herein by reference.

BACKGROUND

1. Field of the Invention

The present invention relates to an organic light emitting display and a method of fabricating the same, and more particularly, to an organic light emitting display capable of preventing the generation of screen distortion caused by a thick film phenomenon that occurs when the internal surface of a panel is coated with a first absorbing member and of increasing light efficiency to improve contrast, and a method of fabricating the same.

2. Discussion of Related Art

Recently, various small and light flat panel displays (FPD) capable of reducing weight and volume that are disadvantages of cathode ray tubes (CRT) have been developed. FPDs include liquid crystal displays (LCD), light emitting displays (LED), field emission displays (FED), and plasma display panels (PDP).

Among the FPDs, the LEDs are used over a wide range of temperatures, are resistant to shock and vibration, and have a wide viewing angle and high response speed so that it is possible to provide high quality moving images. Therefore, the LEDs are spotlighted as next generation FPDs.

The LED can be categorized as an organic light emitting display using an organic light emitting diode and an inorganic light emitting display using an inorganic light emitting diode. The organic light emitting diode includes an anode electrode, a cathode electrode, and an organic emission layer positioned between the anode electrode and the cathode electrode to emit light by combination of electrons and holes. The inorganic light emitting diode includes an inorganic emission layer, for example, an emission layer formed of PN junction semiconductor unlike the organic light emitting diode.

The organic light emitting display includes a substrate on which an image display unit including at least one organic light emitting diode is formed and a panel formed on the substrate to seal the image display unit. The internal surface of the panel that faces the organic light emitting diode is coated with an absorbing member for absorbing moisture that can be received from the outside of the organic light emitting display.

In order to have the internal surface of the panel coated with the absorbing member, a spraying method or a screen printing method can be used. In accordance with the spraying method, a nozzle is used to form an absorbing member of uniform shape and thickness. In accordance with the screen printing method, after a net-shaped metal sheet is masked, an absorbing member of a desired shape is printed onto the internal surface of the panel using a squeeze.

However, when the absorbing member is formed using the screen printing method among the above-described methods, a thick film phenomenon in which the circumference of the absorbing member is thicker due to the compression force of the squeeze or the viscosity of the absorbing member occurs. The thick film phenomenon causes a difference in refractive indexes of the absorbing member so that screen distortion occurs. When the above-described spraying method is used, a dropping phenomenon occurs in a region, in particular, in the circumference of the absorbing member with which the internal surface of the panel is coated. Therefore, screen distortion may be caused even when the absorbing member is formed using the spraying method. Furthermore, the light emitted from the organic light emitting diode may not be transmitted only through the front of the panel but through the both sides of the panel. Therefore, emission efficiency may deteriorate.

SUMMARY OF THE INVENTION

In accordance with the present invention an organic light emitting display capable of preventing the generation of screen distortion caused by a thick film phenomenon that occurs when the internal surface of a panel is coated with an absorbing member, and a method of fabricating the same, is provided.

Further in accordance with the present invention, an organic light emitting display capable of preventing light emitted from an organic light emitting diode from being transmitted through other regions than an image display unit, and a method of fabricating the same, is provided.

The foregoing and/or other aspects of the present invention are achieved by providing an organic light emitting display having a substrate on which an image display unit including at least one organic light emitting diode is formed, a panel formed on the substrate to seal the image display unit, a first absorbing member formed on at least an internal surface of the panel on the image display unit that faces the organic light emitting diode, and a second absorbing member formed on the circumference of the image display unit between the first absorbing member and the internal surface of the panel to overlap the circumference of the first absorbing member.

The second absorbing member in an exemplary embodiment is angular ("ㄱ") or planar ("—") shaped. The second absorbing member prevents the light emitted from the organic light emitting diode from being transmitted through the circumference of the first absorbing member and may have a light absorbing function. The second absorbing member may be formed of a colored metal thin film or organic film and in one embodiment, may be of the color black. The second absorbing member may be a single-layered or multi-layered and the thickness of the second absorbing member may be in the range of 5 to 15 µm.

The first absorbing member may be formed of one of PNPL, BaO, and CaO. The first absorbing member may be formed by a screen printing method or a spraying method. The first absorbing member absorbs moisture received from the outside.

The panel have an "U" or planar shaped cross-section. The organic light emitting display further includes a sealing member formed between the edge of the panel whose cross-section is planar shaped and the substrate to seal the image display unit. The panel may be transparent.

A method of fabricating the organic light emitting display includes: providing a substrate on which an image display unit including at least one organic light emitting diode is formed, providing a panel formed on the substrate to seal the image display unit, forming a second absorbing member on the internal surface of the panel along the circumference of the image display unit, forming a first absorbing member on the internal surface of the panel that faces the organic light emitting diode on the image display unit to at least partially overlap the circumference of the second absorbing member, forming an adhesive on the circumference of the substrate or the panel, and sealing the panel in which the first and second absorbing members are formed and the substrate on which the image display unit including the at least one organic light emitting diode is formed.

DETAILED DESCRIPTION

Figure 1:
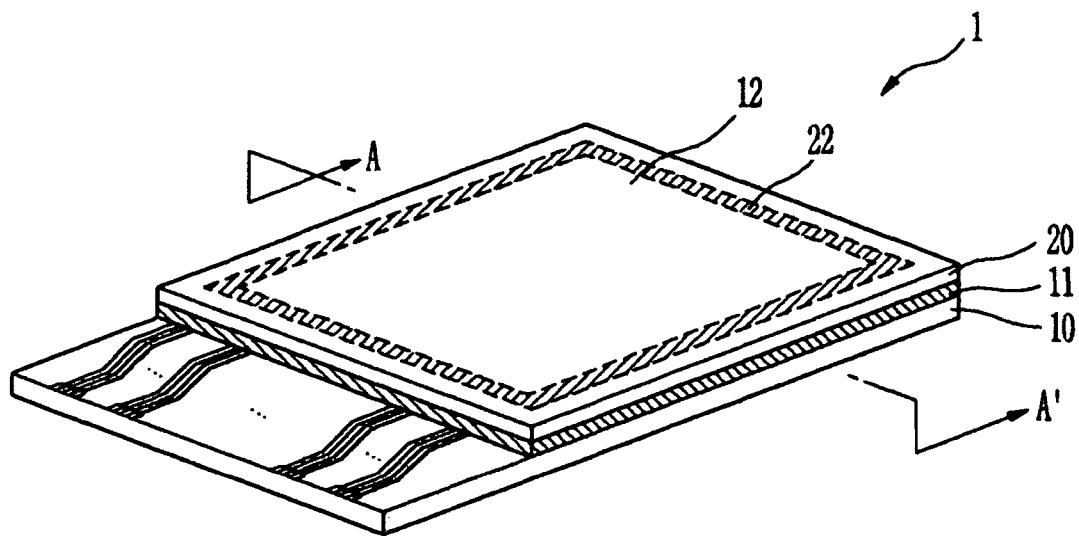
FIG. 1 is a schematic perspective view of an organic light emitting display in accordance with the present invention.
Figure 4:
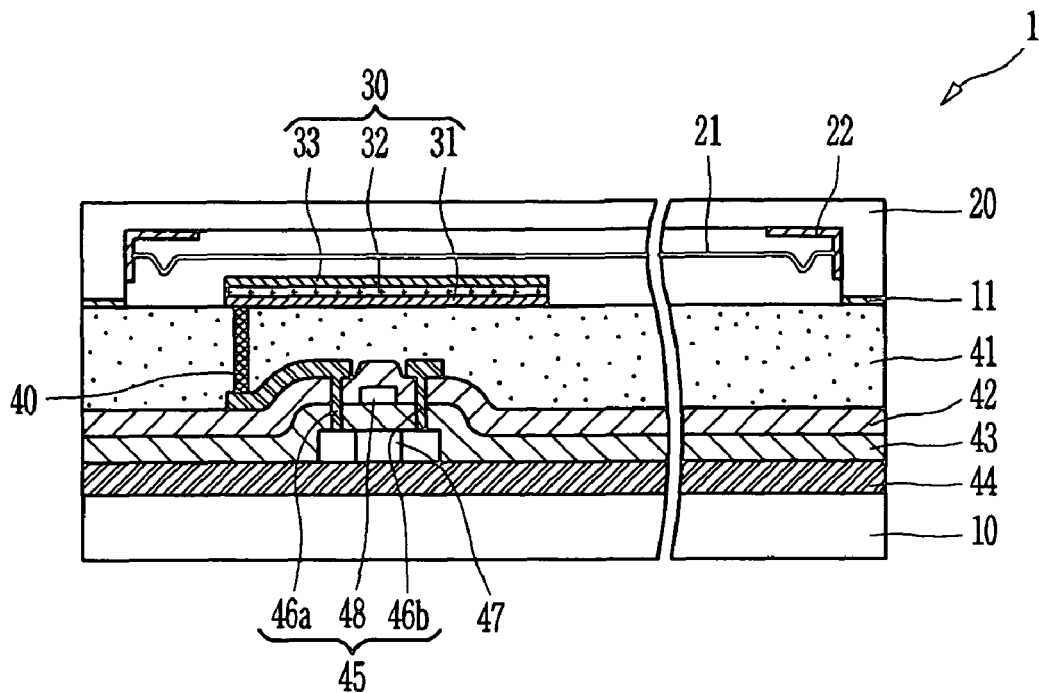
FIG. 4 is a cross-sectional view illustrating an organic light emitting display in accordance with a first embodiment taken along the line A-A' of FIG. 1.

Referring to FIGS. 1 and 4, the organic light emitting display 1 in accordance with the present invention includes a substrate 10 on which an image display unit 12 having at least one organic light emitting diode is formed, a panel 20 formed on the substrate 10 to seal the image display unit 12, a first absorbing member 21 formed on the internal surface of the panel 20 on the image display unit 12 that faces the organic light emitting diode, and a second absorbing member 22 formed on the circumference of the image display unit 12 between the first absorbing member 21 and the panel 20 to overlap the circumference of first absorbing member 21 by a predetermined width. Here, a thin film transistor (TFT) and the organic light emitting diode are formed on the substrate 10. A detailed description of the substrate will follow later.

The panel 20 may have various shapes. In accordance with the embodiments of the present invention, the panel 20 may have a "U" shaped cross-section (e.g., have an open-ended box shape), or have a planar shaped cross-section. Transparent plastic or glass having an insulation property is used as the panel 20. In particular, since glass has a high insulation property and is transparent and resistant to water, glass is mainly used as the panel 20.

Figure 8:
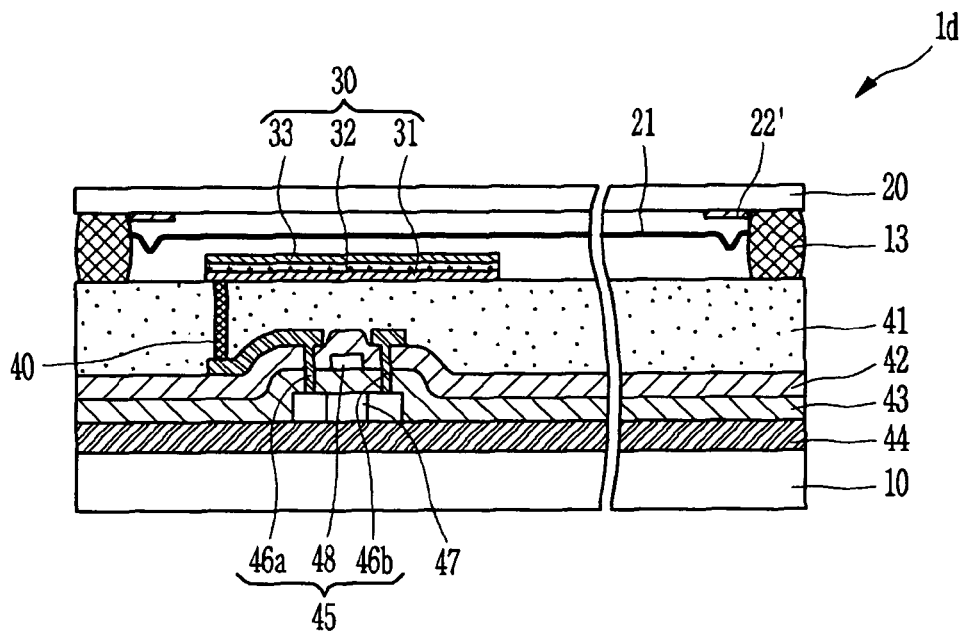
FIG. 8 is a cross-sectional view illustrating an organic light emitting display in accordance with a fifth embodiment taken along the line A-A' of FIG. 1.
Figure 9:
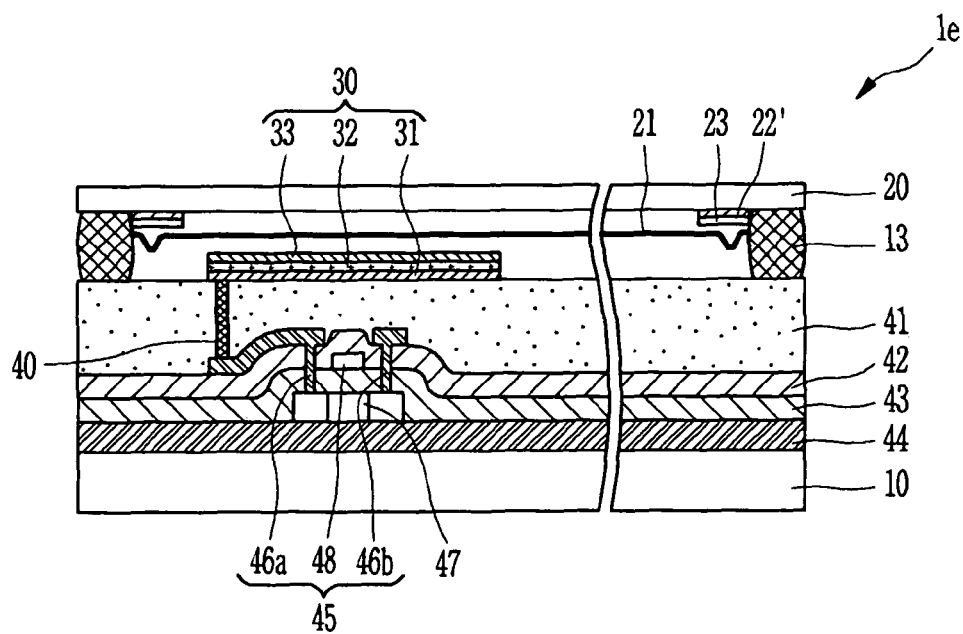
FIG. 9 is a cross-sectional view illustrating an organic light emitting display in accordance with a sixth embodiment taken along the line A-A' of FIG. 1.

When the panel 20 whose cross-section is planar shaped is used, a sealing member 13 (as seen in FIGS. 8 and 9) having a predetermined height is used in the part adhered to the substrate 10. The sealing member 13 is formed to be thicker than the first and second absorbing members 21 and 22' formed on the internal surface of the panel 20 by a predetermined thickness so that the organic light emitting diodes do not contact the absorbing members.

Referring back to FIG. 4, the first absorbing member 21 formed on the internal surface of the panel 20 is commonly formed of a physical desiccant such as zeolite, silica gel, carbon, and carbon nano tube, a desiccant obtained by dissolving an organic metal complex in a petroleum solvent such as toluene, xylene, and an aliphatic organic solvent, and a chemical adsorbent. The adsorbent is preferably a compound that chemically absorbs moisture and that maintains the absorbed moisture solid. Such a compound includes alkali earth metal oxide such as CaO, BaO, and MgO, sulfate such as $Li_2SO_4$, $Na_2SO_4$, $CaSO_4$, $MgSO_4$, $COSO_4$, $Ga_2(SO_4)_3$, $Ti(SO_4)_2$, and $NiSO_4$, and polymer nano particle layer (PNPL) and is not limited to the above. In accordance with the present embodiments, the first absorbing member 21 is formed of the PNPL and by the screen printing method or the spraying method. The first absorbing member 21 is formed at a dry atmosphere and in a decompressed state in order not to be affected by moisture and oxygen.

On the other hand, the second absorbing member 22 may be angular or planar shaped. The second absorbing member 22 is formed not to cover the image display unit 12, in particular, the organic light emitting diode. The second absorbing member 22 prevents the light emitted from the organic light emitting diode from being transmitted through the circumference of the first absorbing member 21. The second absorbing member 22 serves as an adsorbent. The second absorbing member 22 is formed of a colored metal thin film or a colored organic film, in particular, a black metal thin film or a black organic film having highest light shielding efficiency and may be formed of a single layer or a multiple layer. The second absorbing member 22 may be formed by variously combining the angular and planar shaped second absorbing members 22 to at least partially overlap the circumference of the first absorbing member 21 on the circumference of the image display unit 12.

The thickness of the second absorbing member 22 is in the range of 5 to 15 μm. The width of the second absorbing member 22 in the part that overlaps the first absorbing member 21 on the internal surface of the panel 20 is in the range of 0.8 to 1.2 mm. The height of the region that contacts the internal side of the panel 20 is in the range of 0.2 to 0.6 mm. In accordance with an embodiment of the present invention, the thickness of the second absorbing member 22 is 10 μm. However, modification can be made within the scope of the present invention.

Figure 2A:
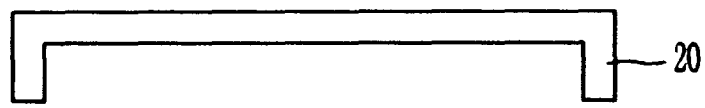
FIGS. 2A to 2C are cross-sectional views of a panel in accordance with the present invention in each fabrication process.
Figure 2B:
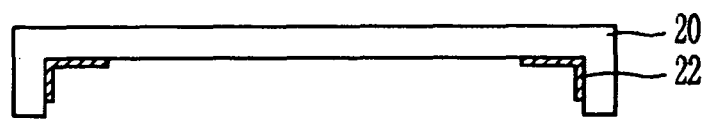
Figure 2C:
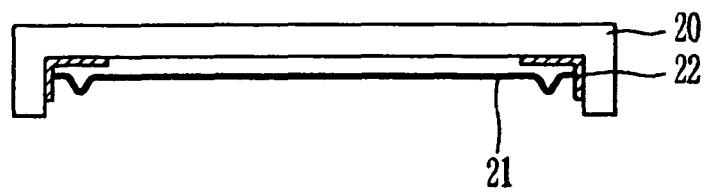
Figure 3:
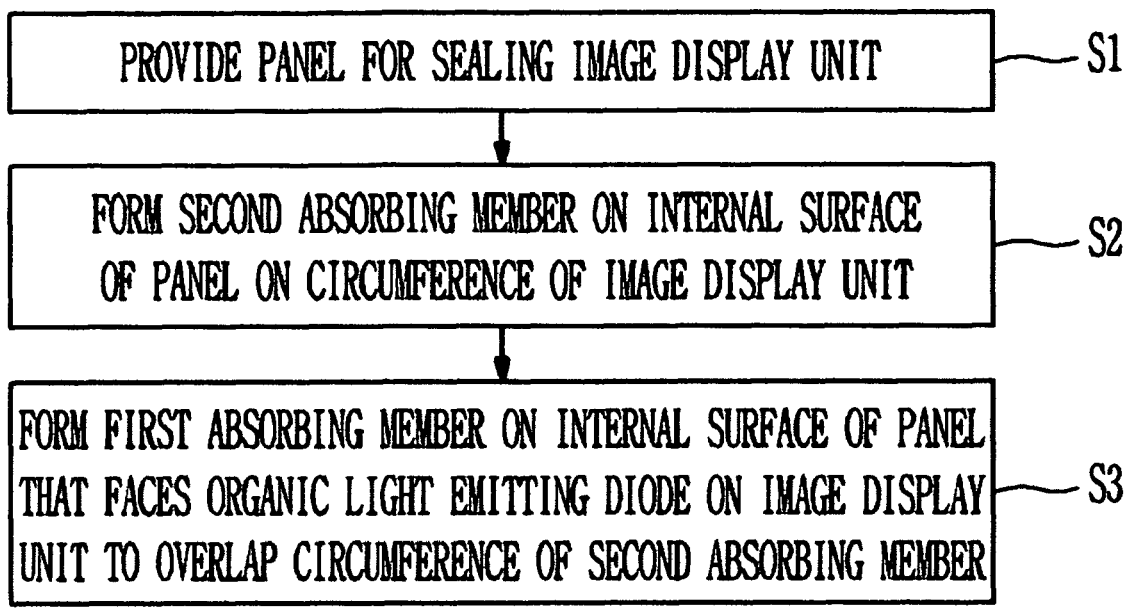
FIG. 3 is a block diagram illustrating each fabrication process of the panel in accordance with the present invention.

FIGS. 2A to 2C are cross-sectional views of a panel on which the second absorbing member in accordance with the present invention is formed in each fabrication process. FIG. 3 is a block diagram of the panel of FIG. 2 in each fabrication process.

Referring to FIGS. 2A to 2C and FIG. 3, the panel 20 on which the second absorbing member in accordance with the present invention is formed is provided (FIG. 2A and S1 in FIG. 3). The panel 20 has a "U" shaped cross-section and is formed of transparent glass or plastic to transmit the light emitted from the organic light emitting diode (not shown). When the panel 20 is provided, the second absorbing member 22 is formed on the internal surface of the panel 20 (FIG. 2B and S2 in FIG. 3). The second absorbing member 22 is formed to have a predetermined width on the internal surface of the panel 20 and on the circumference of panel 20 so as not to cover the organic light emitting diode of the image display unit 12. The second absorbing member 22 is formed of a colored metal film or a colored organic film that can absorb the light emitted from the organic light emitting diode. Next, the first absorbing member 21 is formed on the internal surface of the panel 20 that faces the organic light emitting diode (FIG. 2C and S3 in FIG. 3). As described above, the first absorbing member 21 is formed by the screen printing method or the spraying method and may be formed of various adsorbents. In accordance with the present embodiments, the first absorbing member 21 is formed of transparent PNPL.

According to the organic light emitting display 1 of the present invention, the region from the organic light emitting diode to the panel 20 includes transparent and semi-transparent members so that the light emitted from the organic light emitting diode is absorbed by the panel 20.

Referring back to FIG. 4, a schematic cross-sectional view illustrates an organic light emitting display in accordance with a first embodiment taken along the line A-A' of FIG. 1. The organic light emitting display 1 includes a substrate 10 on which an image display unit 12 including at least one organic light emitting diode 30 is formed and a panel 20 formed on the substrate 10 and having a "U" shaped cross-section to seal the image display unit 12.

A thin film transistor (TFT) 45 and the organic light emitting diode 30 are formed on the substrate 10. A buffer layer 44 is formed on the substrate 10 of the TFT 45. A semiconductor layer 47 is formed on the buffer layer 44. A gate insulating film 43 is formed on the semiconductor layer 47. The TFT 45 composed of a gate electrode 48, a source electrode 46a, and a drain electrode 46b is formed on the gate insulating film 43. An interlayer insulating film 42 is formed between the gate electrode 48 and the source and drain electrodes 46a and 46b. A planarizing film 41 is formed on the TFT 45. A contact hole 40 for electrically connecting the planarizing film 41 and the organic light emitting diode 30 to each other is formed in the planarizing film 41.

The organic light emitting diode 30 is formed on the planarizing film 41 and includes a first electrode (an anode electrode) 31, an emission layer 32, and a second electrode (a cathode electrode) 33. Also, although not shown in the drawing, a hole injection layer (HIL) and a hole transfer layer (HTL) are formed between the first electrode 31 and the emission layer 32, an electron transfer layer (ETL) and an electron injection layer (EIL) are sequentially stacked between the emission layer 32 and the second electrode 33, and a pixel defining film (not shown) is further formed on the planarizing film 41 and the first electrode 31. Here, the first electrode 31 may be formed of the cathode electrode and the second electrode 33 may be formed of the anode electrode.

The first absorbing member 21 formed on the image display unit 12 and the angular shaped second absorbing member 22 formed between the first absorbing member 21 and the internal surface of the panel 20 on the circumference of the image display unit 12 to at least partially overlap the circumference of the first absorbing member 21 are formed on the internal surface of the panel 20 that faces the organic light emitting diode 30 to prevent light from being transmitted through the top and side of the panel 20. The second absorbing member 22 in accordance with the present invention shields external light and reflects the internal light emitted from the organic light emitting diode 30 to prevent light from leaking. Therefore, it is possible to improve contrast and light efficiency and to prevent screen distortion from being generated by the difference in refractive indexes caused by the difference in thickness of the circumference of the first absorbing member 21 on an actual screen due to a thick film phenomenon in which the circumference of the first absorbing member 21 becomes thicker in the process of coating the internal surface of the panel with the adsorbent.

FIGS. 5 to 9 are schematic cross-sectional views illustrating an organic light emitting display in accordance with second to sixth embodiments taken along the line A-A' of FIG. 1. Description of the same elements as the elements of the first embodiment will be omitted. In particular, description of the substrate 10 on which the TFT 45 and the organic light emitting diode 30 are formed will be omitted.

Figure 5:
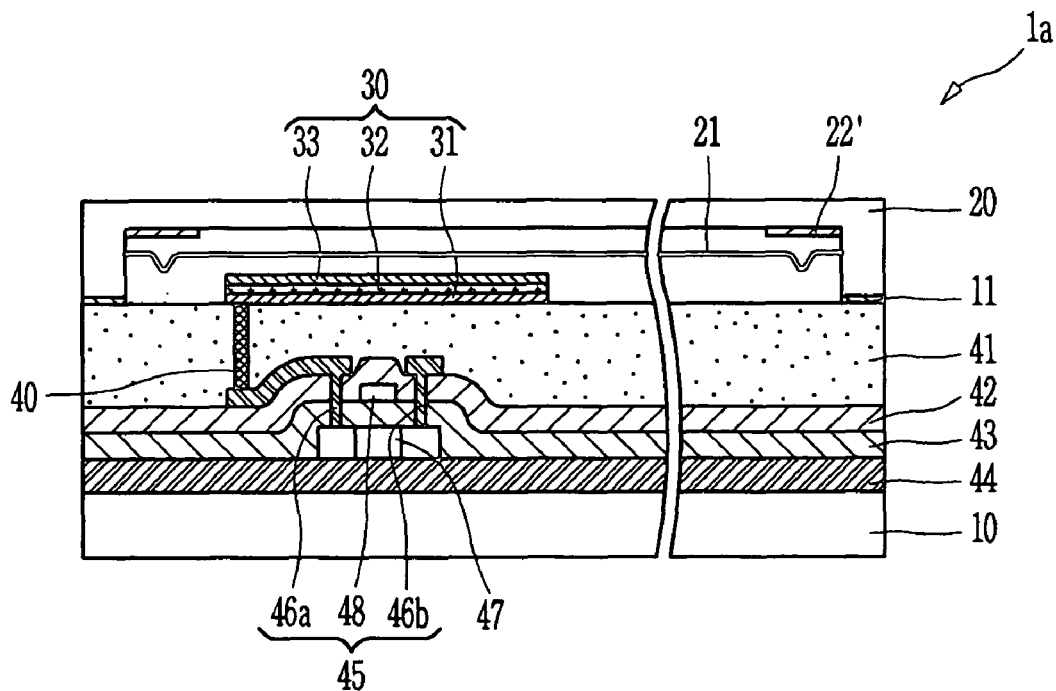
FIG. 5 is a cross-sectional view illustrating an organic light emitting display in accordance with a second embodiment taken along the line A-A' of FIG. 1.

Referring to FIG. 5, in accordance with a second embodiment of the present invention, the organic light emitting display 1a includes a substrate 10 on which an image display unit 12 including at least one organic light emitting diode 30 is formed and a panel 20 formed on the substrate 10 and having a "U" shaped cross-section to seal the image display unit 12. The first absorbing member 21 formed on the image display unit 12 and the planar shaped second absorbing member 22' formed between the first absorbing member 21 and the internal surface of the panel 20 on the circumference of the image display unit 12 to at least partially overlap the circumference of the first absorbing member 21 are formed on the internal surface of the panel 20 that faces the organic light emitting diode 30 to prevent light from being transmitted through the top of the panel 20.

Figure 6:
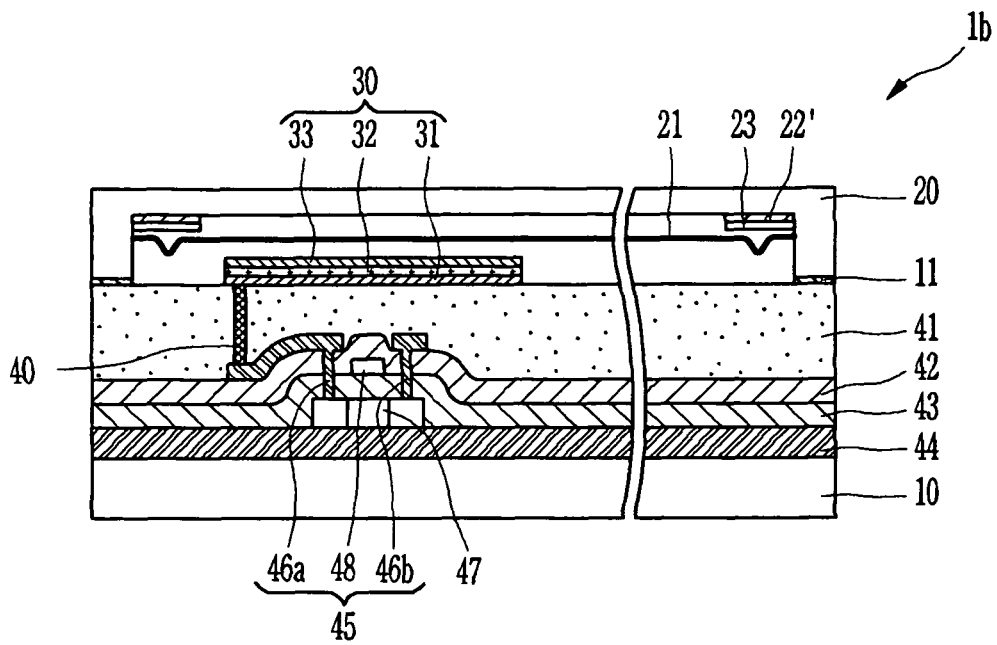
FIG. 6 is a cross-sectional view illustrating an organic light emitting display in accordance with a third embodiment taken along the line A-A' of FIG. 1.

Referring to FIG. 6, in accordance with a third embodiment of the present invention, the organic light emitting display 1b includes a substrate 10 on which an image display unit 12 including at least one organic light emitting diode 30 is formed and a panel 20 formed on the substrate 10 and having a "U" shaped cross-section to seal the image display unit 12. The first absorbing member 21 formed on the image display unit 12, the planar shaped second absorbing member 22' formed between the first absorbing member 21 and the internal surface of the panel 20 on the circumference of the image display unit 12 to at least partially overlap the circumference of the first absorbing member 21, and a third absorbing member 23 are formed on the internal surface of the panel 20 that faces the organic light emitting diode 30 to prevent light from being transmitted through the top of the panel 20. It is possible to improve the light-shielding efficiency when the third absorbing member 23 is added to the second absorbing member 22'.

Figure 7:
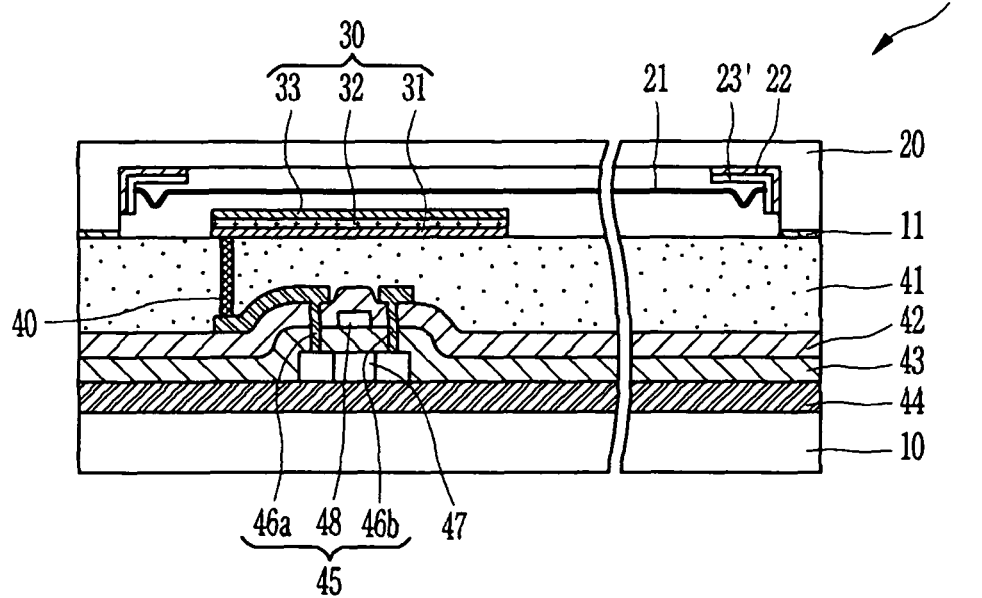
FIG. 7 is a cross-sectional view illustrating an organic light emitting display in accordance with a fourth embodiment taken along the line A-A' of FIG. 1.

Referring to FIG. 7, in accordance with a fourth embodiment of the present invention, the organic light emitting display 1c includes a substrate 10 on which an image display unit 12 including at least one organic light emitting diode 30 is formed and a panel 20 formed on the substrate 10 and having a "U" shaped cross-section to seal the image display unit 12. The first absorbing member 21 formed on the image display unit 12, the angular shaped second absorbing member 22 formed between the first absorbing member 21 and the internal surface of the panel 20 on the circumference of the image display unit 12 to at least partially overlap the circumference of the first absorbing member 21, and a third absorbing member 23' are formed on the internal surface of the panel 20 that faces the organic light emitting diode 30 to prevent light from being transmitted through the top of the panel 20. It is possible to improve the light-shielding efficiency when the third absorbing member 23' is added to the second absorbing member 22.

Referring to FIG. 8, in accordance with a fifth embodiment of the present invention, the organic light emitting display 1d includes a substrate 10 on which an image display unit 12 including at least one organic light emitting diode 30 is formed and a panel 20 formed on the substrate 10 and having a planar shaped cross-section to seal the image display unit 12. The first absorbing member 21 formed on the image display unit 12, the planar shaped second absorbing member 22' formed between the first absorbing member 21 and the internal surface of the panel 20 on the circumference of the image display unit 12 to at least partially overlap the circumference of the first absorbing member 21, and a sealing member 13 are formed on the internal surface of the panel 20 that faces the organic light emitting diode 30 to prevent light from being transmitted through the top of the panel 20.

Referring to FIG. 9, in accordance with a sixth embodiment of the present invention, the organic light emitting display 1e includes a substrate 10 on which an image display unit 12 including at least one organic light emitting diode 30 is formed and a panel 20 formed on the substrate 10 and having a planar shaped cross-section to seal the image display unit 12. The first absorbing member 21 formed on the image display unit 12, the planar shaped second absorbing member 22' formed between the first absorbing member 21 and the internal surface of the panel 20 on the circumference of the image display unit 12 to at least partially overlap the circumference of the first absorbing member 21, the third absorbing member 23, and the sealing member 13 are formed on the internal surface of the panel 20 that faces the organic light emitting diode 30 to prevent light from being transmitted through the top of the panel 20. It is possible to improve the light-shielding efficiency when the third absorbing member 23 is added to the second absorbing member 22'.

In accordance with the above-described embodiments, the second absorbing member formed on the internal surface of the panel is composed of one or two layers. However, the second absorbing member may be composed of two or more layers. Also, in accordance with the present embodiments, a top surface emission type organic light emitting diode is used. However, the present invention is not limited to the above. A bottom surface emission type organic light emitting diode may be used, for example.

As described above, in accordance with the present invention, it is possible to prevent the generation of the screen distortion caused by the thick film phenomenon that occurs in the conventional screen printing and spraying methods by additionally forming at least one-layered absorbing member on the circumference of the first absorbing member and to prevent light from leaking. Therefore, it is possible to improve light efficiency and to thus improve contrast. Also, it is possible to apply various processes so that it is possible to increase the width of selection and to thus improve product competitiveness.

Although exemplary embodiments of the present invention have been shown and described, it would be appreciated by those skilled in the art that changes might be made in this embodiment without departing from the principles and spirit of the invention, the scope of which is defined in the claims and their equivalents.

What is claimed is:

1. An organic light emitting display comprising:
a substrate on which an image display unit having at least one organic light emitting diode is located;
a panel for sealing the image display unit;
a first absorbing member, adapted to transmit visible light and absorb a substance having mass, on at least an internal surface of the panel on the image display unit that faces the at least one organic light emitting diode, the first absorbing member having a center with a first refractive index and a periphery with a second refractive index, the second refractive index different than the first refractive index; and
a second absorbing member, adapted to absorb light, having an opening and comprising a peripheral member around the opening, the peripheral member between the periphery of the first absorbing member and the internal surface of the panel,
wherein the second absorbing member at least partially overlaps a circumference of the first absorbing member.

2. The organic light emitting display as claimed in claim 1, wherein the second absorbing member is angular or planar shaped.

3. The organic light emitting display as claimed in claim 1, wherein the second absorbing member prevents light emitted from the at least one organic light emitting diode from being transmitted through the periphery of the first absorbing member.

4. The organic light emitting display as claimed in claim 1, wherein the second absorbing member is formed of a colored metal thin film or organic film.

5. The organic light emitting display as claimed in claim 4, wherein the second absorbing member is black.

6. The organic light emitting display as claimed in claim 1, wherein the second absorbing member is single-layered or multi-layered.

7. The organic light emitting display as claimed in claim 6, wherein the thickness of the second absorbing member is in the range of 5 to 15 μm.

8. The organic light emitting display as claimed in claim 1, wherein the first absorbing member is formed of one of PNPL, BaO, and CaO.

9. The organic light emitting display as claimed in claim 8, wherein the first absorbing member is formed by screen printing or a spraying.

10. The organic light emitting display as claimed in claim 1, wherein the first absorbing member absorbs moisture received from outside the organic light emitting display.

11. The organic light emitting display as claimed in claim 1, wherein the panel has a "U" shaped cross-section.

12. The organic light emitting display as claimed in claim 1, wherein the panel has a planar shaped cross-section.

13. The organic light emitting display as claimed in claim 12, further comprising a sealing member between an edge of the panel whose cross-section is planar shaped and the substrate to seal the image display unit.

14. The organic light emitting display as claimed in claim 1, wherein the panel is transparent.

15. The organic light emitting display as claimed in claim 1, wherein the second absorbing member is configured to reduce a screen distortion of the organic light emitting display caused by the first absorbing member.

* * * * *